United States Patent [19]

Tyner et al.

[11] 4,122,874

[45] Oct. 31, 1978

[54] APPARATUS FOR STRAIGHTENING THE LEADS OF DUAL IN-LINE PACKAGES

[76] Inventors: Clifford Alan Tyner, 73 Peter, Campbell, Calif. 95008; Dean Lee Westbrook, 377 Jai Dr., San Jose, Calif. 94086

[21] Appl. No.: 695,750

[22] Filed: Jun. 14, 1976

[51] Int. Cl.$^2$ .............................................. B21F 1/02
[52] U.S. Cl. .............................. 140/147; 72/DIG. 10
[58] Field of Search ............. 72/DIG. 10; 140/1, 105, 140/139, 140, 147

[56] References Cited

U.S. PATENT DOCUMENTS

| | | | |
|---|---|---|---|
| 3,336,778 | 8/1967 | Follrath | 72/203 |
| 3,796,201 | 3/1974 | Golub | 140/1 |
| 3,822,728 | 7/1974 | Heller et al. | 140/1 |
| 3,857,420 | 12/1974 | Newman | 140/1 X |
| 3,880,205 | 4/1975 | Linker et al. | 140/147 |
| 4,003,414 | 1/1977 | Halligan | 140/1 |

Primary Examiner—E. M. Combs
Attorney, Agent, or Firm—David A. Boone; Theodore S. Park

[57] ABSTRACT

Two movable members are selectable positioned to form a passageway for handling dual in-line packages. A wheel, comprising resilient material, and a spreader member are selectable positioned in correspondence with the movable members to engage the leads on either side of the package and vertically straighten them. Lateral straightness of the leads, as well as various other package anomalies, are detected by optical scanning.

12 Claims, 13 Drawing Figures

| FIGURE 11A | FIGURE 11B |

APPARATUS FOR STRAIGHTENING THE LEADS OF DUAL IN-LINE PACKAGES

BACKGROUND OF THE INVENTION

Dual in-line packages are widely used to package integrated circuits, various other electronic devices and combinations thereof. As the volume of usage has increased over the years, so have the number of package types produced. For example, these are plastic, ceramic, "Cerdip" and side-brazed packages, to name a few. Also, the package length varies from as few as four leads to as many as 64 and above per package. The width of the package typically varies between 3/10ths and 6/10ths of an inch. The most standard parameter is that of the lead spacing on each side of the package which has been fairly consistently held to 0.100 inches center-to-center.

Increasingly, there have been efforts to automate the operations involved with these dual in-line packages. For example, the initial testing and screening of the packages, and the insertion of the packages into printed circuit boards through the use of automatic insertion equipment. However, variations in the different package types, as described above, and the fact that individual packages in any given lot will suffer from physical deformities, hamper the manufacturer and the user from maximizing the effectiveness of this automatic handling equipment. For example, individual packages may be malformed or have bent leads which cause the automatic handling equipment to jam.

Previous solutions to these problems have included visual inspection and correction of deformities by the operator. Other solutions have included designing passageways of the handling apparatus with looser tolerances or more forgiving mechanisms. A great deal of effort has been directed towards the design of apparatus for handling the devices, for screening devices to detect anomalies in package dimensions and bent leads, and for preforming the leads of the devices to the required tolerances before they are placed in subsequent handling equipment. For example, see U.S. Pat. No. 3,727,757 issued to Claude M. Boissicat on Apr. 17, 1973 and entitled "DIP Handling Apparatus".

These prior art devices have typically been limited to a single package width and the mechanism would therefore be replaced for each width, e.g., 0.300 inch, 0.400 inch, 0.600 inch, etc. This is an inherent disadvantage in the increased cost and low utilization of capital equipment for the manufacturer or user who uses a wide variety of package types. Many of these devices jam or otherwise become inoperative from the very problems for which they are screening and therefore they are not effective outside a fairly small range of package deformities. Also, some prior art lead straighteners and screening equipment have involved techniques such as forcing the package through a forming structure or otherwise stressing the package to force the leads to the desired dimensions. This kind of physical stressing of the package may actually create worse problems than it solves because this physical stressing of the package may destroy the physical integrity of the package, resulting in such undesirable features as a loss of hermiticity.

SUMMARY OF THE INVENTION

In accordance with the preferred embodiment of the present invention, handling apparatus for dual in-line packages and the like is provided, which comprises two parallel movable members which may be selectably positioned to provide a passageway of varying width. The passageway thus formed is designed to receive dual in-line packages on their backs with the leads positioned up in the air. A wheel comprising a resilient material and a spreader member engage the package leads and form them to a preselected lead separation distance. Furthermore, optical scanning apparatus is provided for detecting other physical anomalies in the package width and leads such as unacceptable variations in package heights or the lead spacings which significantly vary from the 0.100 inch standard. The optical scanning apparatus may also be adjusted to detect a number of other physical anomalies. Acceptable and unacceptable packages are then sorted into their respective containers. The handling apparatus thus constructed is capable of handling packages of varying widths and of forming leads within a wide range through simple adjustments. Furthermore, the apparatus is operable on a continuous basis and there is no need to "singulate" or provide reservoirs for the packages during these operations.

DESCRIPTION OF THE PREFERRED EMBODIMENT

Figure 1:
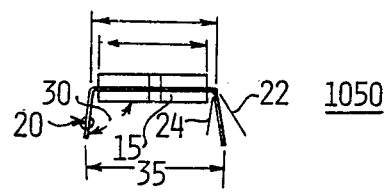
FIG. 1 is an end view of a typical dual in-line package.
Figure 2:
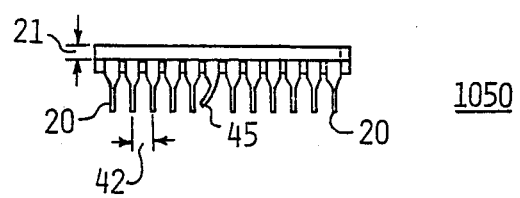
FIG. 2 is a side view of a typical dual in-line package.
Figure 3:
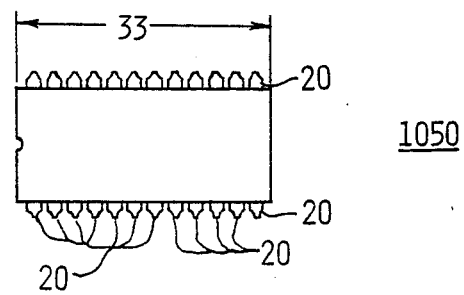
FIG. 3 is a top view of a typical dual in-line package.

Referring to FIGS. 1, 2 and 3 there is shown a dual in-line package 1050 typical of those in use in industry today. These packages typically comprise a body 15 and a plurality of legs 20. Besides variations in package thickness 21, different package types and even the same type supplied by different manufacturers will vary in the angle 30 between the legs and the body and the distance 35 between the legs on the respective sides of the packages. The angle 30 between the legs and the package is dependent on the type of package, the manufacturing techniques and package specifications of the particular manufacturer. Distance 35 is nominally a standard distance such as 0.300, 0.400, or 0.600 inches. Various factors such as the tolerances applied to these distances and, of course, individual package deformities caused by handling and shipping, etc., will operate to cause distance 35 to be either greater or smaller than acceptable limits. When lead spacing on a package exceeds or falls below these limits, it becomes difficult to insert in a printed circuit (PC) board and will cause jams in automatic handling equipment.

In FIG. 1 it can be seen that lead 22 has been bent outward from the package and has hence exceeded the acceptable tolerances within the standard distance, while lead 24 has been bent inward to a point where it falls below the acceptable tolerances for distance 35. In the ensuing discussion of the preferred embodiment, this type of deformity will be referred to as longitudinal straightness or the lack thereof.

In FIG. 2 a side view of the dual in-line package is shown. Note that the majority of legs 20 are spaced apart at uniform distance 42. However, note that leg 45 has been deformed, i.e., it is bent sidewards. This type of deformity also causes a problem when attempts are made to insert the device in a printed circuit board. However, studies have shown that by far the greatest problem is a deformity as shown in FIG. 1. Hence, the dual in-line package handling apparatus of the preferred embodiment will correct for longitudinal straightness to bring all the legs 20 into alignment at approximately nominal distance 35. Optical scanning apparatus is then provided to detect lateral straightness problems such as shown in FIG. 2. These devices which lack straightness are then sorted into a separate container to be straightened at a later time.

Figure 4:
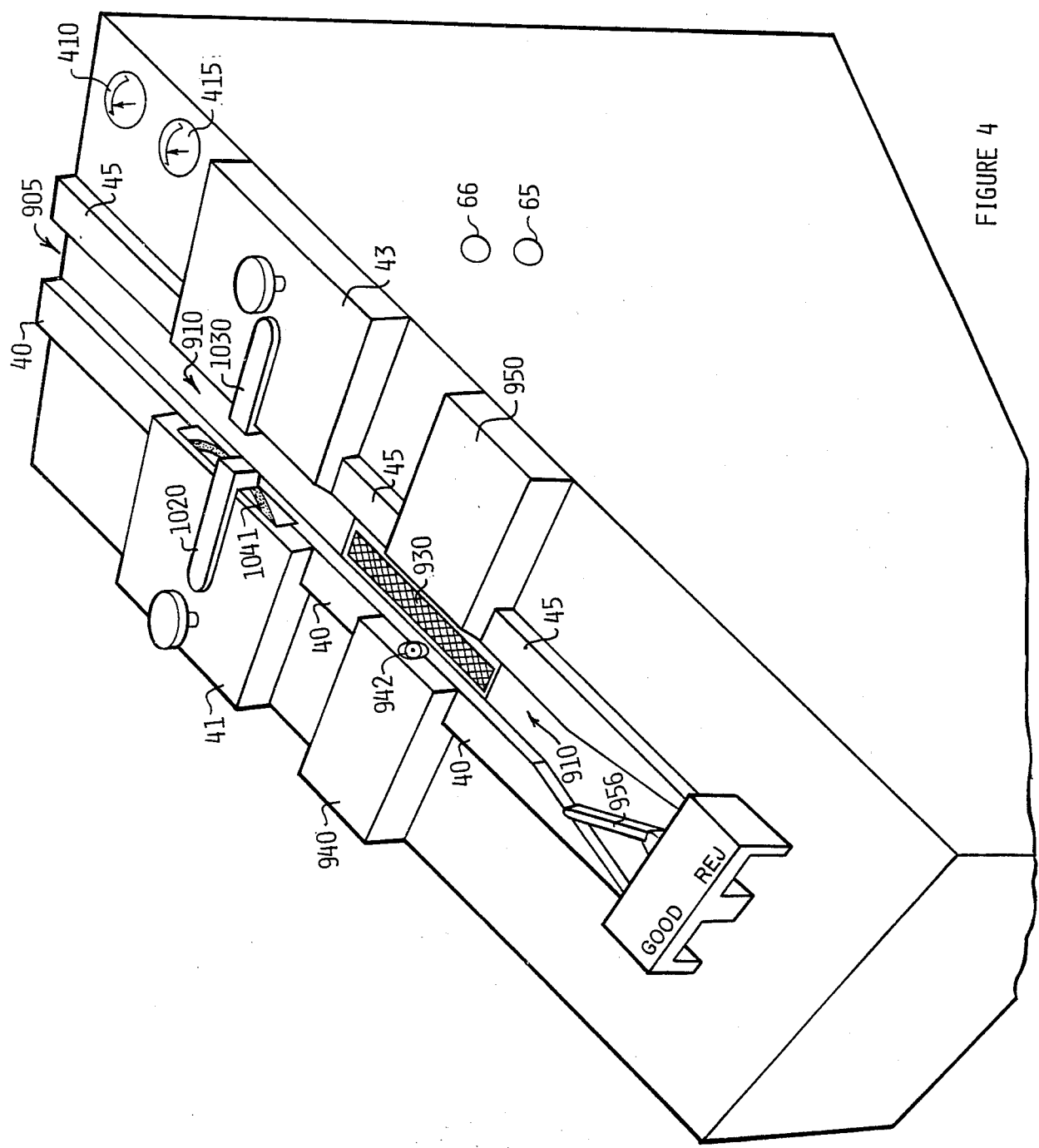
FIG. 4 is a perspective view of the preferred embodiment.

In FIG. 4 there is shown a perspective view of the preferred embodiment. Packages to be formed are inserted at opening 905. The width of the passageway 910 formed by movable members 40 and 45 may be adjusted to accommodate the desired package width by adjustment 65. The desired lead spread may be independently varied by adjustment 66. In the preferred embodiment, adjustment 65 controls the passageway width while adjustment 66 controls the lead spacing widths, i.e., distance 35 per FIG. 1, to which lead forming assemblies 41 and 43 will form the leads of the packages fed through passageway 910. The operation of lead forming assemblies 41 and 43 is described in more detail with respect to FIGS. 5, 6, 7 and 8. Indicators 410 and 415 are provided to display the distances set by adjustments 66 and 65, respectively.

After lead forming apparatus 41 and 43 have formed the leads of the package to the distance preselected by lead spread adjustment 66, the leads now being formed longitudinally straight after this operation, the package proceeds down passageway 910 and is then engaged by a belt 930.

Figure 10:
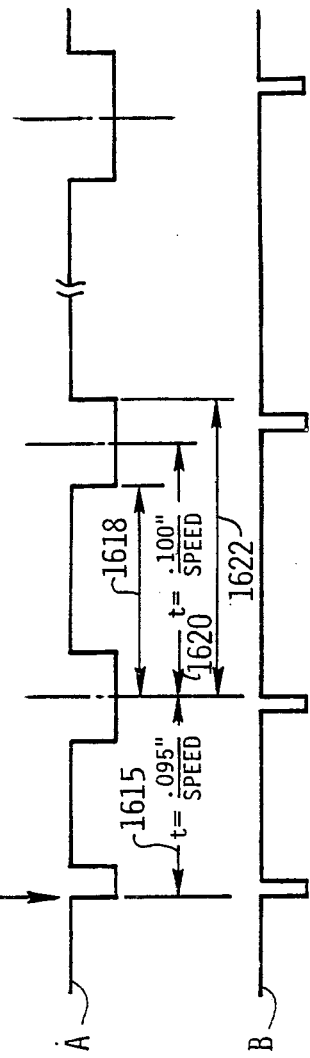
FIG. 10 is a timing diagram of the optical scanning circuitry of the preferred embodiment.

Belt 930 is provided to insure a more constant velocity as the packages proceed past optical-scanning units contained in assemblies 940 and 950. (Belt 930 is driven by a constant velocity motor.) Each side is scanned by a separate scanning unit, such as scanning unit 942. This unit and the associated electronic circuitry described in more detail with respect to FIGS. 9, 10 and 11 determine whether the lateral spacing on each side of the package is within the selectably programmed tolerances. The acceptable and reject packages are then directed to their respective containers by flipper 956 in response to a control signal from the scanning apparatus. Therefore, only those packages which are rejected need be passed through apparatus for correcting improper lateral lead spacing. Since this apparatus is inherently more expensive and slower in operation, significant economies can be realized by only performing lateral straightening operations on those devices which actually require them.

Figures 5, 6:
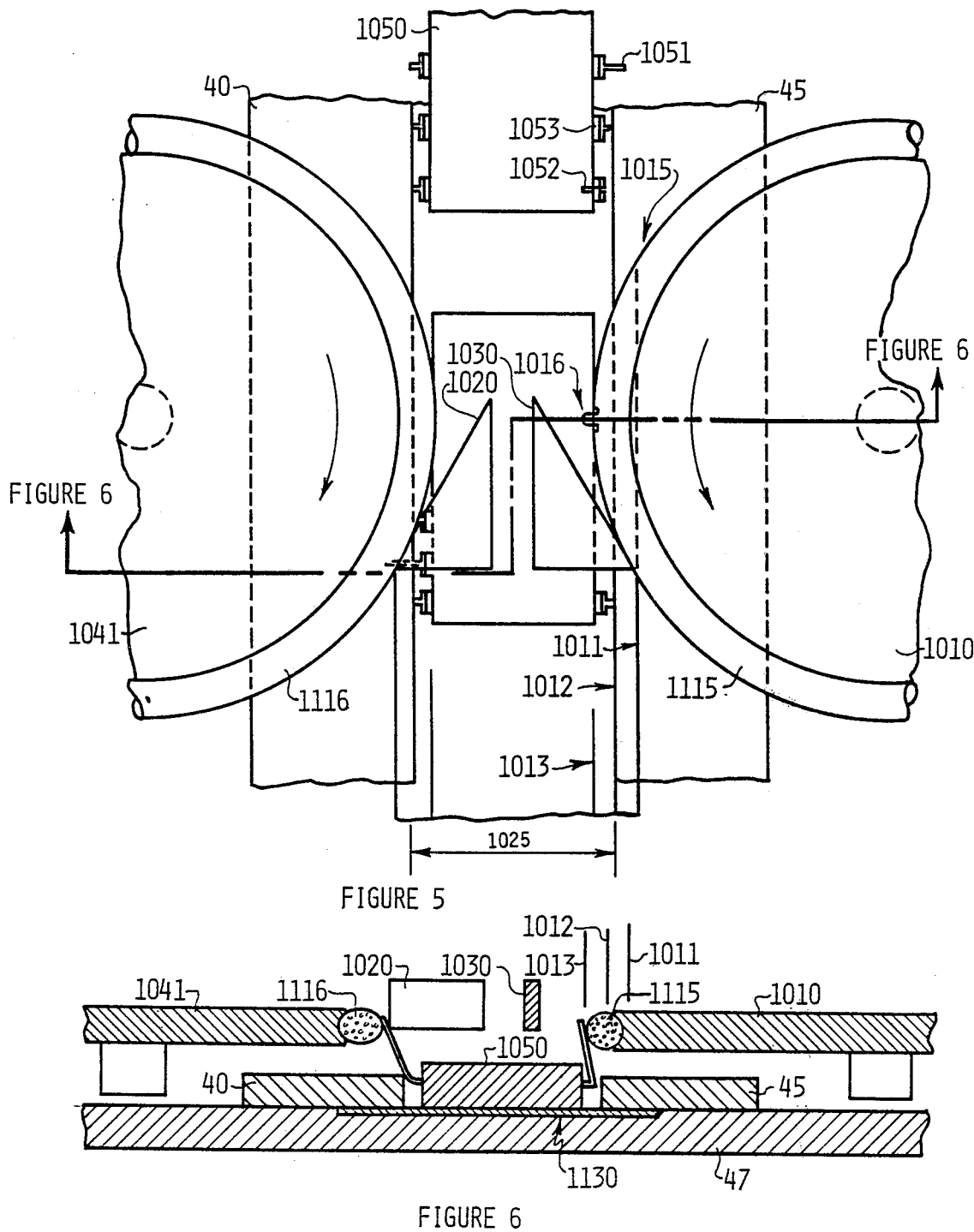
FIG. 5 illustrates the lead forming apparatus utilized in the preferred embodiment.
FIG. 6 is a cross-sectional view of FIG. 5 and shows the relationship of the resilient wheel and the spreader member of the preferred embodiment with respect to a dual in-line package in the passageway of the preferred embodiment.
Figure 7:
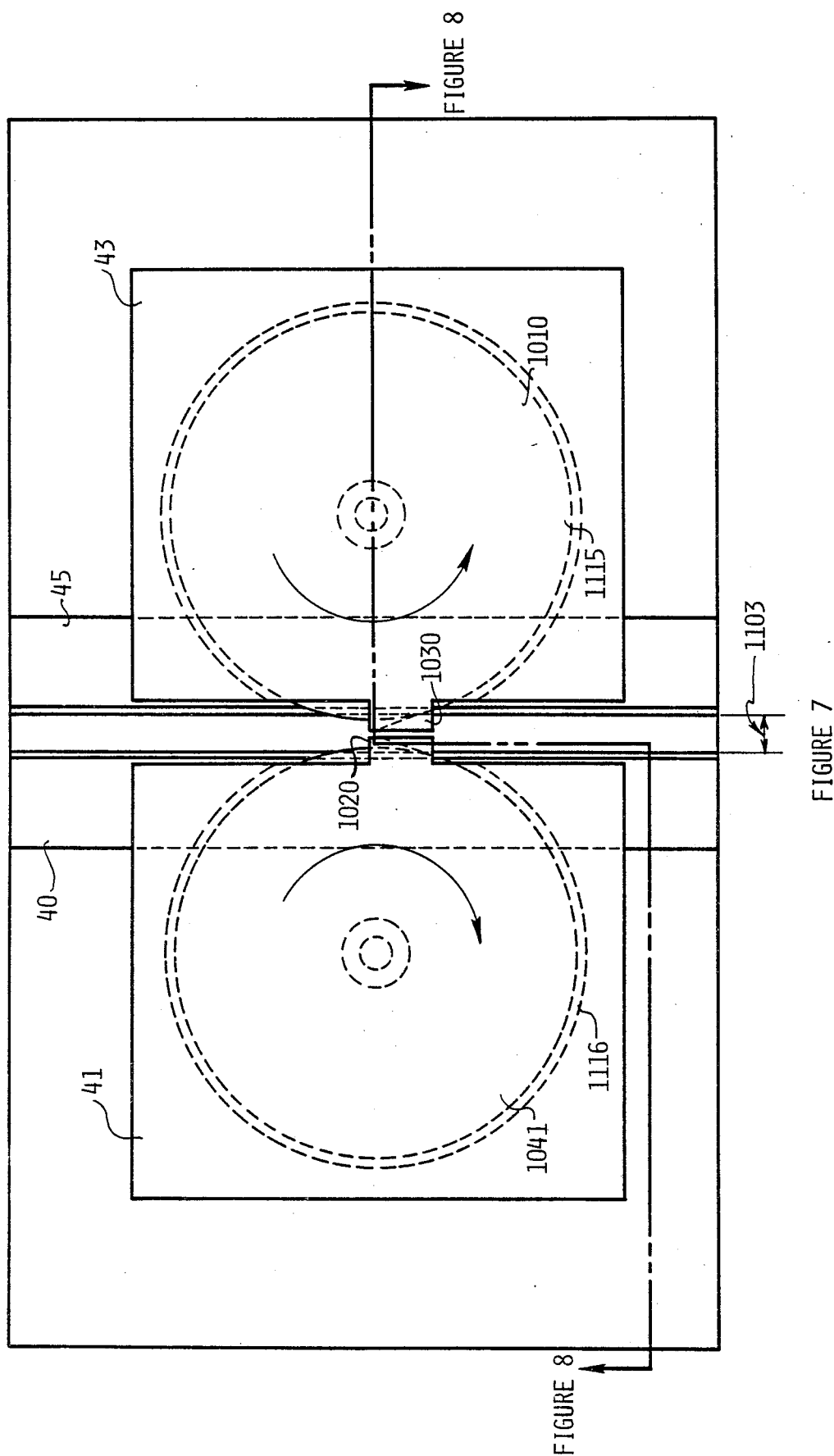
FIG. 7 is a top view of the lead forming assembly of the preferred embodiment.

Referring now to FIG. 5, there is shown the lead forming apparatus of the preferred embodiment. Dual in-line packages such as package 1050 travel down the passageway formed by movable members 40 and 45. These packages may have leads which are bent longitudinally, such as leads 1051 and 1052, respectively. Assuming that it is desired to bend leads into alignment along line 1012, a wheel 1010, having an O-ring 1115 of resilient material positioned about the circumference thereof, is utilized to first bend all the leads inwards to the approximate position of line 1013 and a spreader member 1030 is utilized to bend the leads outwards to the approximate position of line 1011. This is necessary because of the spring-back or memory characteristics of the lead material. (In the preferred embodiment this spring-back distance is approximately equal to the distance from line 1012 to either line 1011 or 1013.) For example, lead 1051, which is bent outwards, must be overbent to the approximate position of line 1013 in order that it will be in line with line 1012 after it has sprung back after completion of the forming operation. To form all leads properly, the leads are first engaged by the wheel 1010 somewhere between points 1015 and 1016 and bent inwards in line with line 1013. If these leads were then released, the spring-back quality of the lead material causes them to line up with line 1012. However, this will only occur if the leads were in-line already or were bent outwards, such as lead 1053 or lead 1051, respectively. For leads which are bent inwards, such as lead 1052, it is necessary to bend the leads outwards in line with line 1011 so that they will then spring back in-line with line 1012. Therefore, after the leads have been engaged by resilient wheel 1010, and bent inwards to the approximate position of line 1013. They are then engaged by spreader bar 1030 and forced outwards into approximate alignment with line 1011. The disengagement point from wheel 1010 and spreader bar 1030 is the tangential meeting of wheel 1010 and spreader bar 1030 at a point 1026 which has been designed in the preferred embodiment to be in line with line 1011. Obviously, the corresponding operations are performed on the leads extending from the other side of the device by wheel 1041 and spreader bar 1020. In this way, the leads are formed to the distance 1025 which has been set by adjustment 66.

In the preferred embodiment the resilient portion of wheels 1010 and 1041 comprises O-rings 1115 and 1116, as shown in the cross-sectional view of FIG. 6, which are positioned in circumferential grooves in the body of wheels 1010 and 1041. If prolonged usage of the lead forming apparatus results in severe abrasion of the resilient surface, the O-ring may be replaced. Similarly, a replaceable insert 1130 is provided in base 47.

Figure 8:
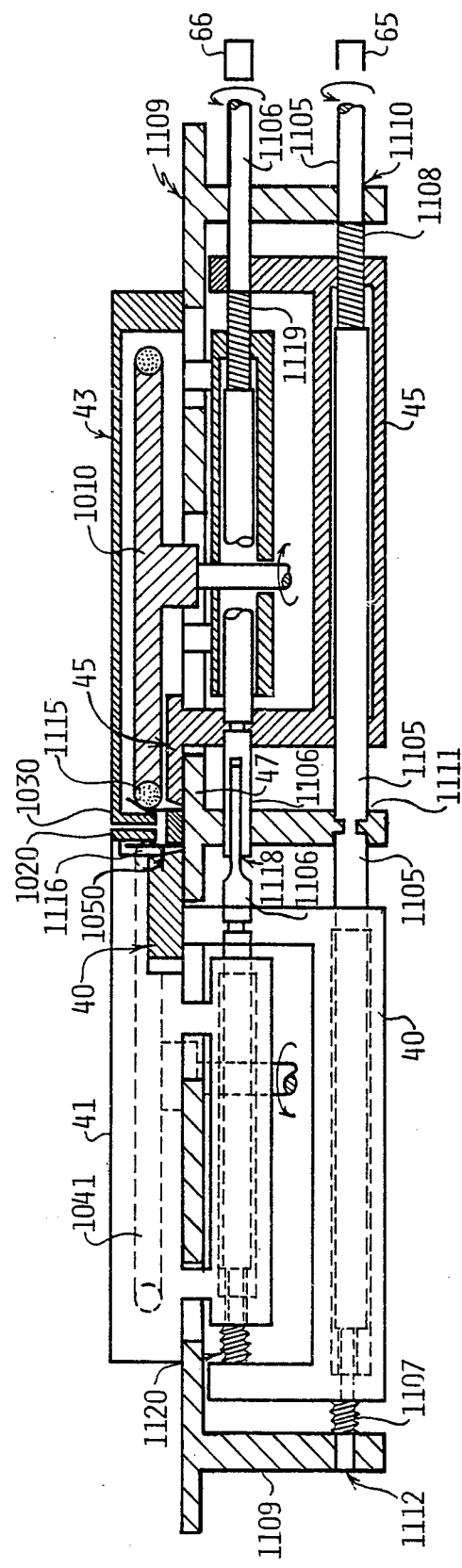
FIG. 8 is a cross-sectional view of FIG. 7 and shows the structure used to adjust the separation distance of the movable members and the lead forming apparatus.

Referring now to FIG. 8, there is shown the passageway used in the preferred embodiment. The dual in-line packages are handled in an essentially upside down position. Therefore, deformities in the lateral and longitudinal straightness of the leads present minimal obstruction to the progress of the package through the passageway. In contrast to the prior art, the passageway of the preferred embodiment is adjustable to accommodate various package widths, i.e., movable members 40 and 45 are not limited to a single passageway width. Other dual in-line packages handling apparatus may be coupled to or mounted upon these movable members 40 and 45 and the distance therebetween may also be independently adjusted to accommodate other package parameters or operations thereon.

In the cross-sectional views of FIG. 6 and FIG. 8, it can be seen that the passageway of the preferred embodiment is formed by movable members 40 and 45 and base 47. Movable members 40 and 45 are adjusted to accommodate the width of a particular package 1050. This is accomplished by the rotation of threaded shaft 1105. The lower portion of movable member 40 rides upon a portion of threaded shaft 1105 having right-handed threads while the lower portion of movable member 45 rides on a portion of threaded shaft 1105 which has left-handed threads. (In FIG. 8, threaded portions 1120 and 1107 of threaded shafts 1106 and 1105, respectively, are right-handed threads while threaded portions 1119 and 1108 are left-handed threads.) Since the screw threads driving movable members 40 and 45 are opposite in direction, movable members 40 and 45 either move towards or move away from each other in response to the turning of shaft 1105. Note that this technique of adjusting the passageway width also has the advantage that the movable members maintain a common centerline no matter what package width is selected. This allows elements not mounted on movable members 40 and 45, such as flipper 956, to also maintain proper spatial relationship for the package width selected.

Bearing supports 1110, 1111, and 1112 are provided to restrict threaded shaft 1105 to purely rotational movement as much as possible. When shaft 1105 is rotated, it not only moves movable members 40 and 45 but also moves the lead forming assemblies comprising wheels 1010 and 1041 and spreader members 1020 and 1030.

However, the lead forming assemblies are capable of further adjustment (without interfering with the spatial relationship of movable members 40 and 45) through adjustment 66 which controls the rotation of a shaft 1106. The turning of shaft 1106 moves the lead forming assemblies closer together or further apart depending on the direction of rotation. Furthermore, note that a slip clutch 1118 is provided in threaded shaft 1106 to allow the distance between the lead forming assemblies to be adjusted independently of the positioning of movable members 40 and 45.

Figure 9:
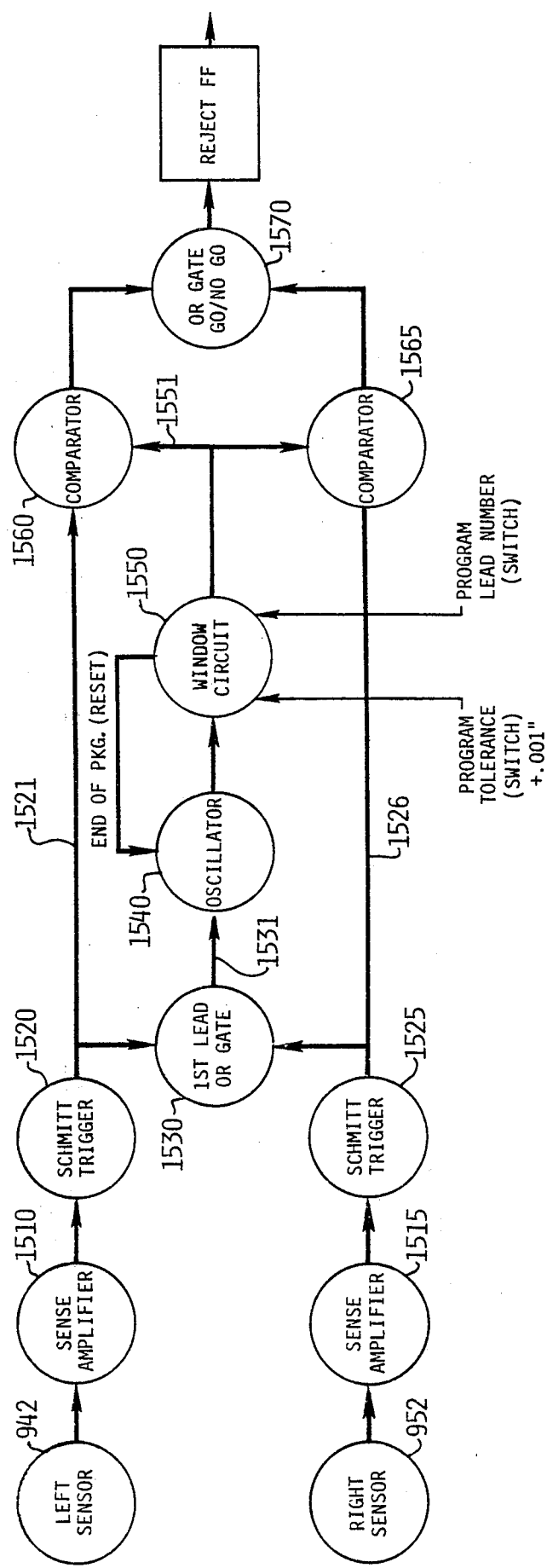
FIG. 9 is a block diagram of the optical scanning circuitry of the preferred embodiment.

Referring now to FIG. 9, there is shown a block diagram of the optical scanning circuitry of the preferred embodiment. Lead spacing on both sides of the package is checked simultaneously by left scanner 942 and right scanner 952, respectively. Any high quality optical scanner, such as those manufactured by the Skan-a-matic Corporation, may be used to detect the presence of each lead. In the preferred embodiment, a fiber optic scanner is used, Model S 3010-3 of the Skan-a-matic Corporation. The scanner produces an output signal whenever light transmitted by the scanner is returned by a reflecting surface passing thereby. In the preferred embodiment, these reflecting surfaces are the leads of the dual in-line package. The reflected light is sensed by a photo transistor in scanners 942 and 952. The output signal of the scanner is amplified by sense amplifiers 1510 and 1515. The signals from sense amplifiers 1510 and 1515 are sent to Schmitt triggers 1520 and 1525 for pulse shaping. When the first lead of the package is sensed, OR-gate 1530 produces an output on a line 1531. The signal on line 1531 causes oscillator 1540 and window circuit 1550 to produce an output signal on line 1551. The waveform of this signal is shown on line A of FIG. 10. Negative going pulses are produced at a time interval approximately equal to the time interval that each successive lead should pass the scanner if the leads are properly spaced. The selection of this time interval is based upon the distance between the leads, the tolerances selected and upon the approximate velocity of the device as it passes the scanner. Note that the belt 930 as described with respect to FIG. 4 helps to insure that the device will move past the scanners at a near constant velocity.

In the preferred embodiment, the first lead sensed is assumed to be directly on center and therefore the first time interval provided is equal to 0.095 inches divided by the approximate speed of the device past the scanner. Thereafter, each time interval is equal to 0.100 inches divided by the approximate speed of the device past the scanner. The width of the pulses generated by window circuit 1550 determines the deviation from the exact distance of 0.100 inches that will be tolerated. For example, time interval 1618 represents the minimum time interval that will be acceptable between the sensing of adjacent leads, while time interval 1622 indicates the maximum time interval that will be accepted by the scanning circuitry. Time interval 1618 and 1622 correspond to the minimum and maximum inter-lead spacing acceptable for the particular application. Note that the signal on line 1551 is utilized by both comparator 1560 and comparator 1565 to determine whether the signals produced on lines 1521 and 1526 by the scanning apparatus as the leads pass by the scanner are within the acceptable tolerances. In this way not only are the inter-lead spacings on each side of the package checked for correct spacing but also the alignment of one side to the other must be within the accepted tolerances. If any one of the leads on either side of the package is not within acceptable limits, OR-gate 1570 will trigger reject flip-flop 1575. When this occurs, flipper 956 is activated and the device is guided into the reject container.

Figure 11A:
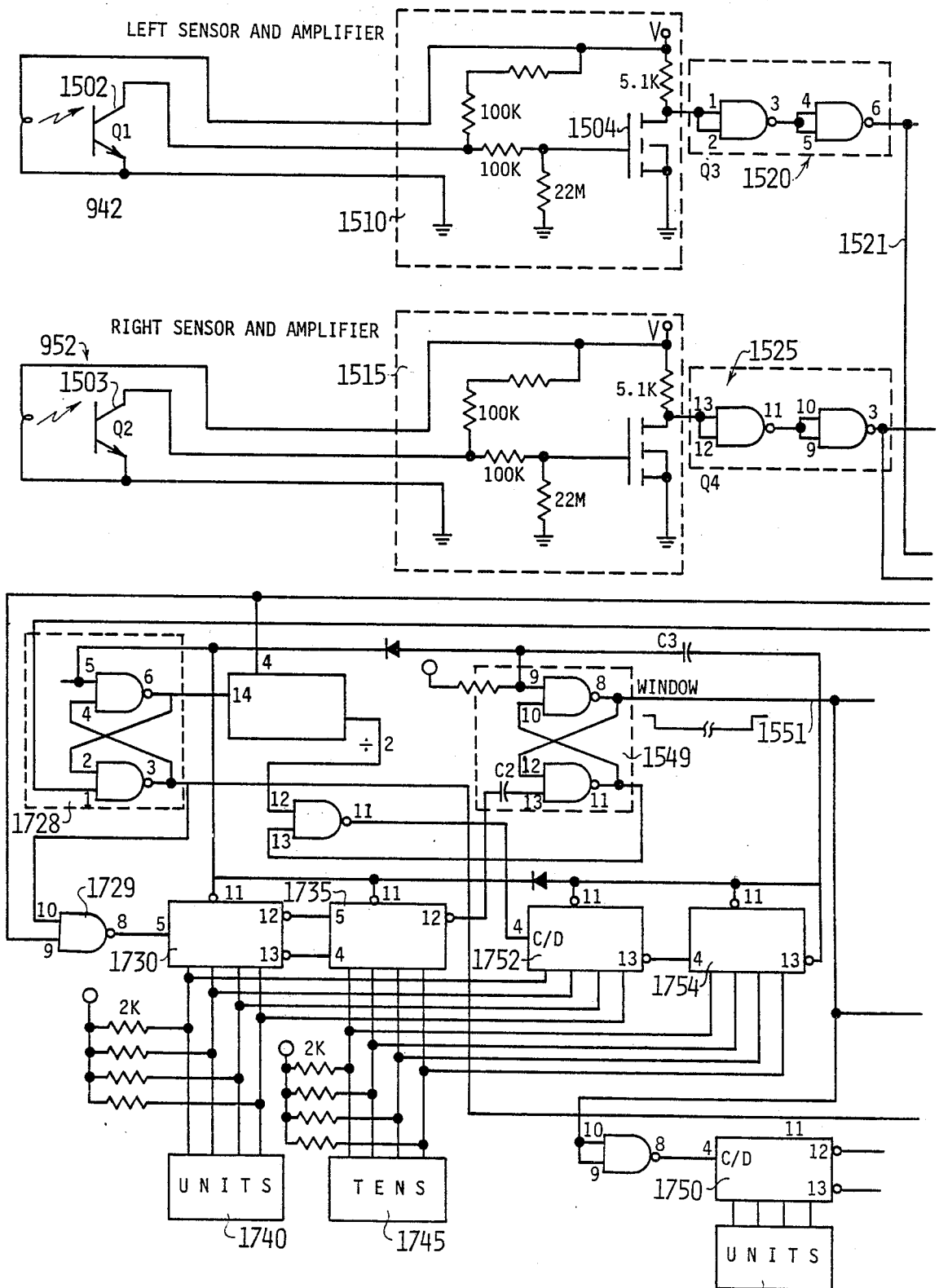
FIGS. 11A and 11B taken together are a schematic diagram of the optical scanning circuitry of the preferred embodiment.
Figures 11, 11B:
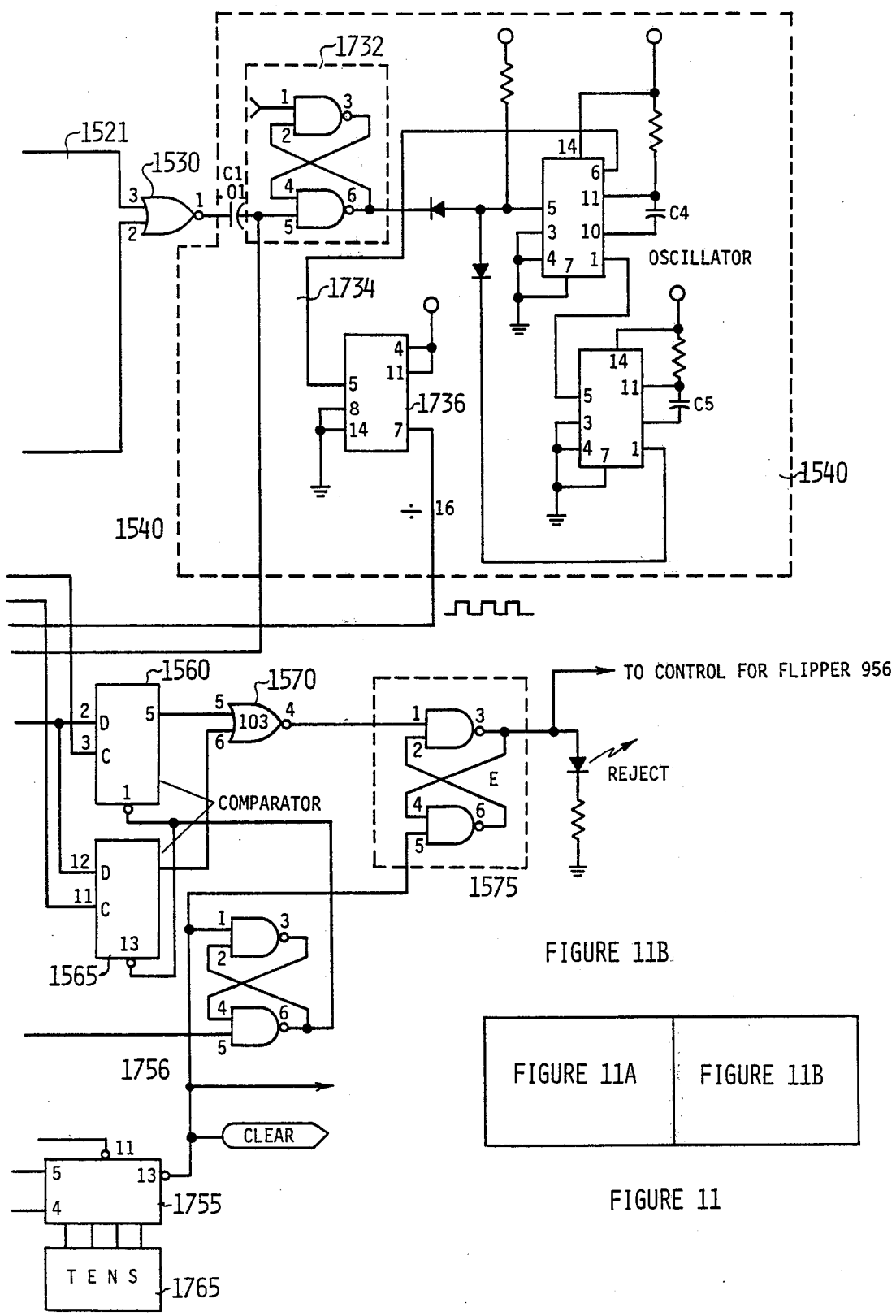
FIG. 11 shows the relationship of FIGS. 11A and 11B.

Referring now to FIGS. 11A and 11B, there is shown a detailed schematic diagram of the optical scanning circuitry of the preferred embodiment. When the leads are detected by optical scanners 942 and 952, they activate sense amplifiers 1510 and 1515 and Schmitt triggers 1520 and 1526, respectively. The first lead to be sensed produces an output signal on line 1521 and 1526 and thereby causes OR-gate 1530 to trigger oscillator 1540. Oscillator 1540 then causes window circuit 1550 to output a train of pulses, the number of said pulses corresponding to the number of leads on each side of the package. The number of leads on each package has been preset into counters 1750 and 1755 via switches 1760 and 1765. The width of the pulses produced is determined by the tolerance which has been selected and input to counters 1730 and 1735 via switches 1740 and 1745. Each time a window pulse is produced, the signal on line 1551 causes counters 1750 and 1755 to count down by one. When the zero count is reached, counter 1755 generates a clear signal on a line 1756 which presets reject flip-flop 1575, as well as various other circuitry in the preferred embodiment.

For the purposes of explanation, we will assume that the left scanner detector 942 has sensed a first lead. Light from the lamp insde the scanner is reflected and actuates photo-transistor 1502. Photo-transistor 1502 turns on and causes the input of transistor 1504 to go low. (Transistor 1504 is similar to the SD 211 manufactured by Signetics Corporation and others.) This causes a high output signal to the input to Schmitt trigger 1520. The output signal on line 1521 is produced, which activates OR-gate 1530. Note that the signal on line 1521 is also coupled to the clock input of flip-flop 1560, but this has no effect as the direct clear input is being held low, which disables this flip-flop. the low going output from OR-gate 1530 is capacitively coupled to flip-flops 1732 and 1728. Flip-flop 1732 enables the oscillator circuit 1540. The oscillator circuit 1540 output signal on line 1734 is the input to divide-by-16 counter 1736. The output of divide-by-16 counter 1736 is coupled to gate 1729 and, through gate 1729, to counters 1730 and 1735. Counters 1730 and 1735 control the time between the detection of the first lead and the start of the succeeding window pulse produced on line 1551. After the first window, counters 1730 and 1735 will count a full 100 count for each lead of the package. The number set in switches 1740 and 1745 are assumed to be in thousands of inches and represent the tolerance from the 0.100 inch standard spacing. This cycling for the full 100 count will continue until latch 1728 is reset, which indicates the last lead has been scanned.

Counters 1752 and 1754 are also preset to the value in switches 1740 and 1745. Counters 1752 and 1754 control the pulse width of the signal produced on line 1551. For example, if a tolerance of 5/1000 inch is set into thumb wheel switches 1740 and 1745, counters 1730 and 1735 will count from a set of 5 to a 100 count, which would yield a total count equivalent to 95, indicating a time interval which represents a distance of 95/1000 inch in the preferred embodiment. As that time a low pulse from counter 1735 sets latch 1549 and commences the generation of the window pulse on line 1551. Simultaneously, down-counters 1752 and 1754 start counting down from the pre-set value of 5. At the completion of this count-down, counter 1754 outputs a negative going signal which causes flip-flop 1549 to set. This countdown from 5 to 0 is equivalent to counting for 10/1000 inch or a count of 10 because of the divide-by-2 effect of flipflop 1728. Hence, a setting of 5 to represent 5/1000 inch initially represents a plus or minus 5/1000 tolerance and therefore a window of 10/1000 inches is produced. If the leads are within tolerance, the comparators 1560 and 1565 will be clocked during the negative going window pulses and the package will therefore not be rejected. However, should a lead be out of tolerance, the detection pulses on lines 1521 and 1526 will not occur simultaneously with window 1551 and hence comparators 1560 and 1565 will be set, thereby causing the output of gate 1570 to set reject flip-flop 1575. The flipper 956 as shown in FIG. 4 will then be activated and the rejected package will be guided to the appropriate receptacle. The counters 1760 and 1765 are preset to the number of leads contained on each side of the package. As a window pulse is generated on line 1551, it causes the counters 1760 and 1765 to count down. When the counters 1760 and 1765 reach a zero count, indicating that all the leads on the package have been scanned, a clear signal will be generated, presetting various internal circuitry such as reject flip-flop 1575.

We claim:

1. Apparatus for straightening lead tips of a moving Dual In-Line Packaged (DIP) electronics device having a body and leads with shoulder and tip portions comprising:

guiding means having members forming a channel disposed to receive a DIP device having lead tips oriented in a generally upward position for guiding the body of the DIP device along a path as it moves by applying biasing force to the shoulder portions of the leads;

a pair of wheels disposed about the path for engaging the lead tips of a DIP device moving along the path and bending the lead tips toward the center of the path as the DIP device moves along the path; and biasing means disposed along the path for bending the lead tips of a DIP device away from the center of the path by applying a bias force to the tips as the DIP device moves along the path.

2. Apparatus as in claim 1 wherein the members are movable for varying dimensions of the path to accommodate different body dimensions.

3. Apparatus as in claim 2 wherein said pair of wheels comprise a first and second wheel each having a resilient portion about the periphery thereof.

4. Apparatus as in claim 2 wherein biasing means comprise a first platen having a surface disposed in tangential relationship with the periphery of the first wheel and oriented at an angle with reference to said path.

5. Apparatus as in claim 4 wherein the periphery of said first wheel forms a radiused surface at the point where the surface of the first platen is in tangential relationship with the first wheel for forming a radiused pivot point for bending the lead tips.

6. Apparatus as in claim 4 wherein the positions of the first platen and the first wheel are movable with reference to said path.

7. Apparatus for straightening lead tips of a moving device having a generally rectangularly shaped body with a plurality of lead tips extending therefrom in a substantially linear array comprising:

guiding means having members forming a channel disposed to receive a device having lead tips in a generally upward position for guiding the body of the device along a path as it moves;

a wheel disposed about the path for engaging the lead tips of a device moving along the path and bending the lead tips toward the center of the path as the device moves; and biasing means disposed along the path for bending the lead tips of a device away from the center of the path by applying a bias force to the tips as the device moves along the path.

8. Apparatus as in claim 7 wherein the members are movable for varying dimensions of the path to accomodate different body dimensions.

9. Apparatus as in claim 7 wherein the wheel has a resilient portion about its periphery.

10. Apparatus as in claim 7 wherein biasing means comprise a platen having a surface disposed in tangential relationship with the periphery of the wheel and oriented at an angle with reference to said path.

11. Apparatus as in claim 10 wherein the periphery of the wheel forms a radiused surface at the point where the surface of the platen is in tangential relationship with the wheel for forming a radiused pivot point for bending the lead tips.

12. Apparatus as in claim 10 wherein the positions of the platen and the wheel are movable with reference to said path.

* * * * *